United States Patent
Liang et al.

(10) Patent No.: US 8,018,282 B2
(45) Date of Patent: Sep. 13, 2011

(54) DRIVING CIRCUIT SYSTEM AND METHOD OF ELEVATING SLEW RATE OF OPERATIONAL AMPLIFIER

(75) Inventors: Yann-Hsiung Liang, Hsinchu (TW); Ko-Yang Tso, Zhonghe (TW); Chin-Chieh Chao, Hsinchu (TW)

(73) Assignee: Raydium Semiconductor Corporation, Hsinchu (TW)

( * ) Notice: Subject to any disclaimer, the term of this patent is extended or adjusted under 35 U.S.C. 154(b) by 198 days.

(21) Appl. No.: 12/579,815

(22) Filed: Oct. 15, 2009

(65) Prior Publication Data
US 2010/0097142 A1    Apr. 22, 2010

(30) Foreign Application Priority Data
Oct. 20, 2008 (TW) ................................ 97140225 A (51) Int. Cl.
*H03F 3/45* (2006.01)
(52) U.S. Cl. ...................................... 330/261; 330/296
(58) Field of Classification Search .................. 330/261, 330/285, 296
See application file for complete search history.

(56) References Cited

U.S. PATENT DOCUMENTS

| 7,479,833 B2* | 1/2009 | Chen et al. | 330/296 |
| 7,944,300 B2* | 5/2011 | Jurasek et al. | 330/261 |
| 2009/0131099 A1* | 5/2009 | Miyashita | 455/550.1 |

* cited by examiner

*Primary Examiner* — Henry Choe
(74) *Attorney, Agent, or Firm* — Morris Manning Martin LLP; Tim Tingkang Xia, Esq.

(57) ABSTRACT

The invention discloses a driving circuit system and a method of elevating a slew rate of an operational amplifier. The driving circuit system comprises an operational amplifier, a judging module and a bias enhancing module. The operational amplifier has an input stage driven by a bias current. The bias enhancing module is electrically connected to the judging module and the input stage of the operational amplifier respectively. The judging module is used to generate a bias enhancing signal according to an edge-trigger of a control signal. When the bias enhancing module receives the bias enhancing signal, the bias enhancing module provides an additional current, which cooperates with the bias current, for driving the input stage of the operational amplifier, so as to elevating a slew rate of the operational amplifier.

18 Claims, 11 Drawing Sheets

DRIVING CIRCUIT SYSTEM AND METHOD OF ELEVATING SLEW RATE OF OPERATIONAL AMPLIFIER

BACKGROUND OF THE INVENTION

1. Field of the Invention

The invention relates to a driving circuit system and a method of elevating a slew rate and. More particularly, the invention relates to a driving circuit system having an operational amplifier (op-amp) with a high slew rate and a method of elevating a slew rate of an operational amplifier.

2. Description of the Prior Art

The operational amplifier structure has a lot of application in modern electronic appliance. For example, the amplifying circuit used in signal processing, the driving circuit used in driving a capacitive load and the signal converting circuit used in converting signals between analog and digital are both practical implements with the operational amplifier structure. Especially, the liquid crystal display (LCD) monitor must drive a great deal of pixel capacitors to compose the displaying image, so that the operational amplifier is usually adopted in a driving circuit.

With the LCD displaying technology developing, the LCD monitor is heading to have a higher display resolution, a larger size and a rapider response time, therefore, there are more challenges in design the driving circuit. The source driver circuit in the LCD monitor includes an output buffer. The output buffer is used for controlling the transmitting of the video information according to a control signal (usually the STB signal).

Figure 1:
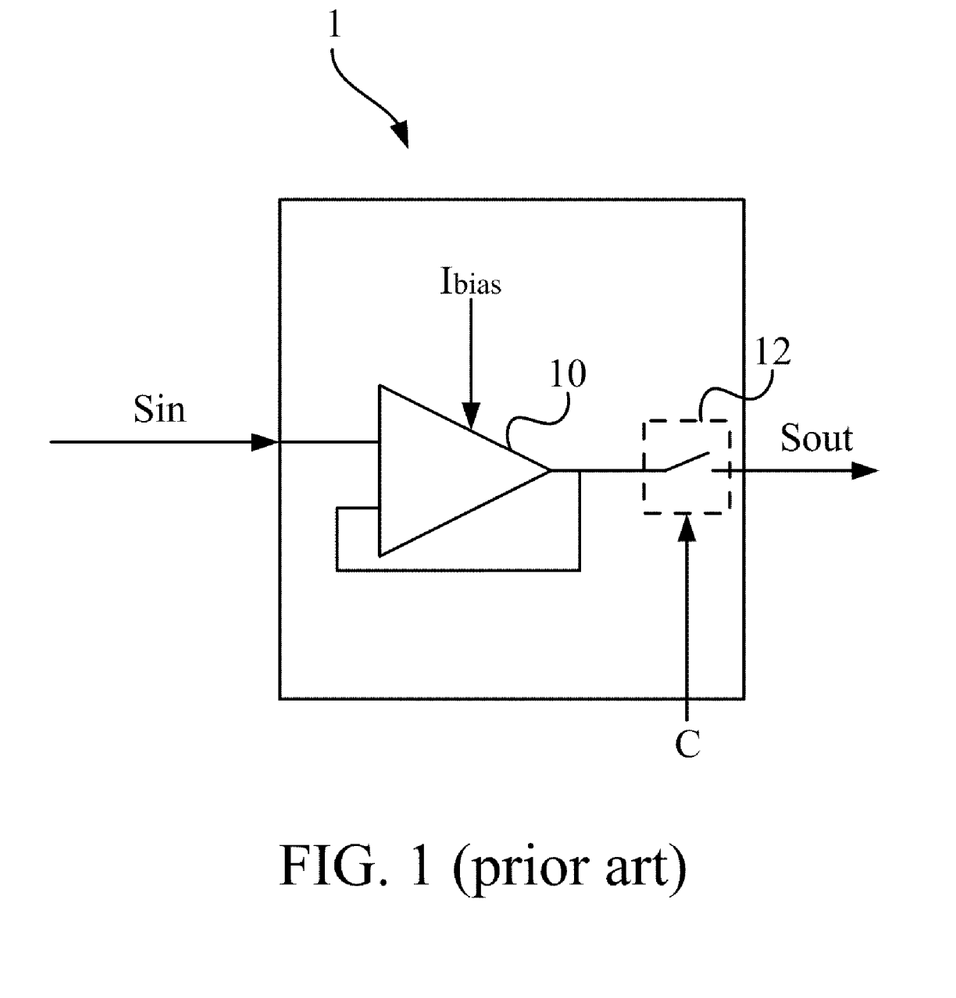
FIG. 1 is a schematic diagram illustrating a driving circuit system in prior art.

Please refer to FIG. 1. FIG. 1 is a schematic diagram illustrating a driving circuit system 1 in prior art. The driving circuit system 1 can serves as an output buffer of a source driver circuit. As shown in FIG. 1, the driving circuit system 1 includes an operational amplifier 10, a feedback loop cooperating with the operational amplifier 10 and an output switch 12, such that the operational amplifier 10 may function as the output buffer. The operational amplifier 10 is biased by a bias current $I_{bias}$. An output terminal of the operational amplifier 10 is coupled to the output switch 12. The output switch 12 is controlled by a control signal C, which can be a STB signal in practical application. The output switch 12 cooperates with the operational amplifier 10 to switch between the states of registering an input signal Sin or generating an output signal Sout.

Figure 2:
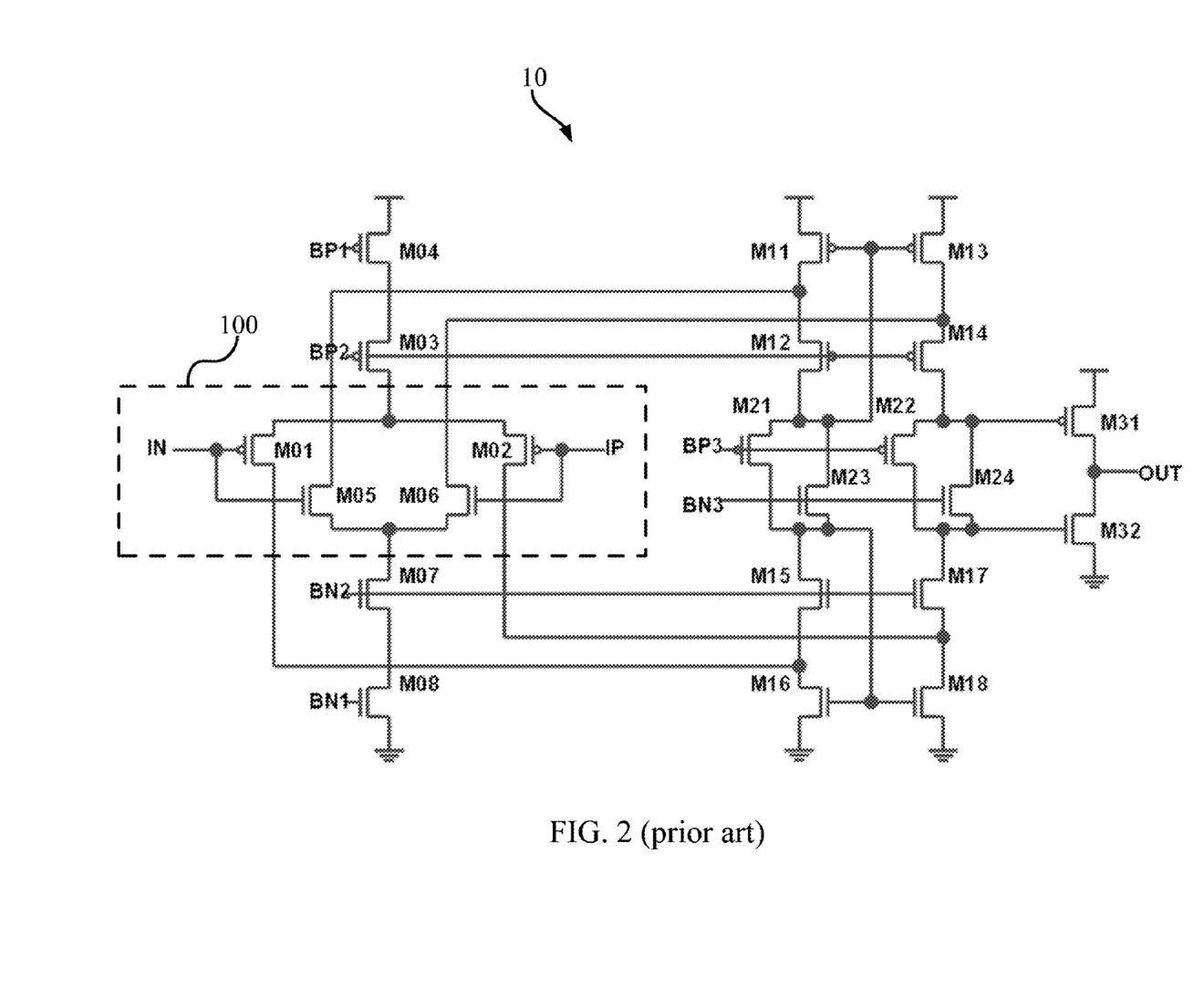
FIG. 2 is a circuit pattern diagram illustrating the operational amplifier in the prior art.

In practical application, to boost the gray level performance of the video display, it needs the operational amplifier to have a full range of input swing, or in other words, a rail-to-rail input range. Therefore, the operational amplifier with a rail-to-rail input stage is widely adopted. Please refer to FIG. 2. FIG. 2 is a circuit pattern diagram illustrating the operational amplifier 10 in the prior art. As shown in FIG. 2, the operational amplifier 10 in practical application may have a parallel rail-to-rail input stage 100 and a class AB output stage.

In general, when the voltage output signal of the output buffer is switched, the changing of the voltage output signal is not ideal but has a certain delay. It takes a certain settling time to complete the changing.

Figure 3:
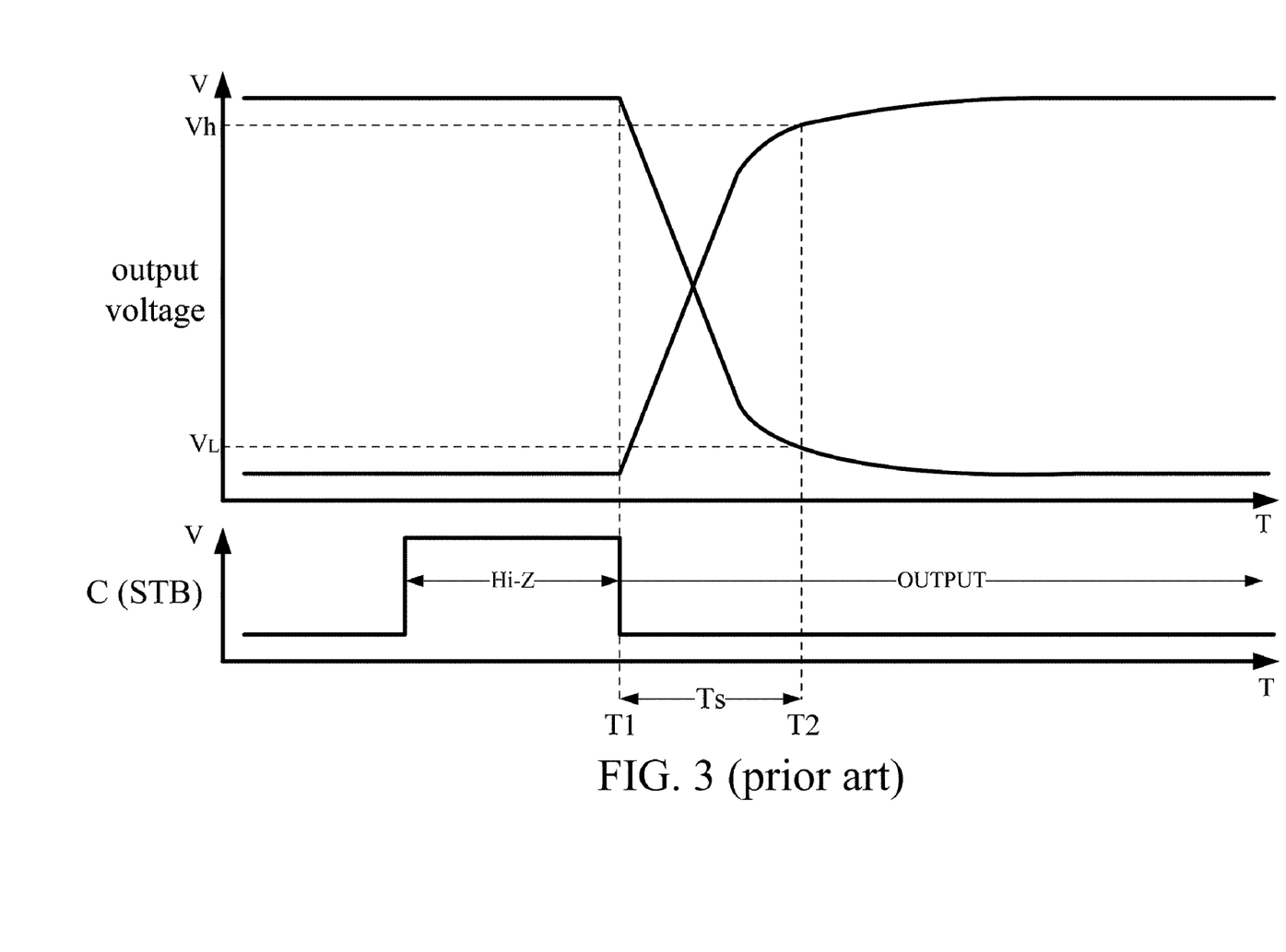
FIG. 3 is a timing diagram illustrating the output voltage of the driving circuit system of prior art.

Please refer to FIG. 3. FIG. 3 is a timing diagram illustrating an output voltage of the driving circuit system 1 of prior art. As shown in FIG. 3, at the beginning, the output voltage may approach to the high level or the low level according the last display state. There is an example illustrating the output voltage changing from the low level to the high level to the demand for displaying. When the operational amplifier received the control signal C at time spot T1, the input voltage started to change from the low level to the high level. Till the output voltage exceeds the high level threshold voltage Vh at the time spot T2, the output voltage has completed the switching operation. The output voltage will approach to and eventually be stable at the high level.

The time period between time spot T1 and the time spot T2 is the mentioned settling time Ts, which is the time period of the output voltage from triggered by the negative edge trigger of the control signal C till exceeding the high level threshold voltage Vh.

On the other hand, the output voltage may need to change from the high level to the low level to the demand for displaying. It takes a settling time Ts from starting changing till descending across the low level threshold voltage $V_L$. The detail manner is similar to said description above.

That is to say, while the source driver circuit is generating the voltage output signal, the settling time Ts is needs for the LCD monitor to complete its function, such that the response speed is limited.

The higher is the slew rate of the operational amplifier within the output buffer, the shorter the settling time is. Consequently, the driving response speed of the source driver circuit is accelerated, and therefore the LCD monitor has a better response time behavior. In prior art, it may elevate the slew rate of the operational amplifier in ways of:

a) reducing the capacitance of a compensation capacitor

By reducing the capacitance of the compensation capacitor, it reduces the charging time can be reduced, and further accelerates the response time and elevates the slew rate of the operational amplifier. However, it reduces the stability of the operational amplifier.

b) adopting a push-pull output stage

Utilizing a differential amplifier for pushing the output stage to form a push-pull output stage can elevate the slew rate of the operational amplifier as well. However, the extra differential amplifier circuit may complex the driving circuit, and further to enlarge the die size of the driving circuit and the static current consumption.

Figure 4:
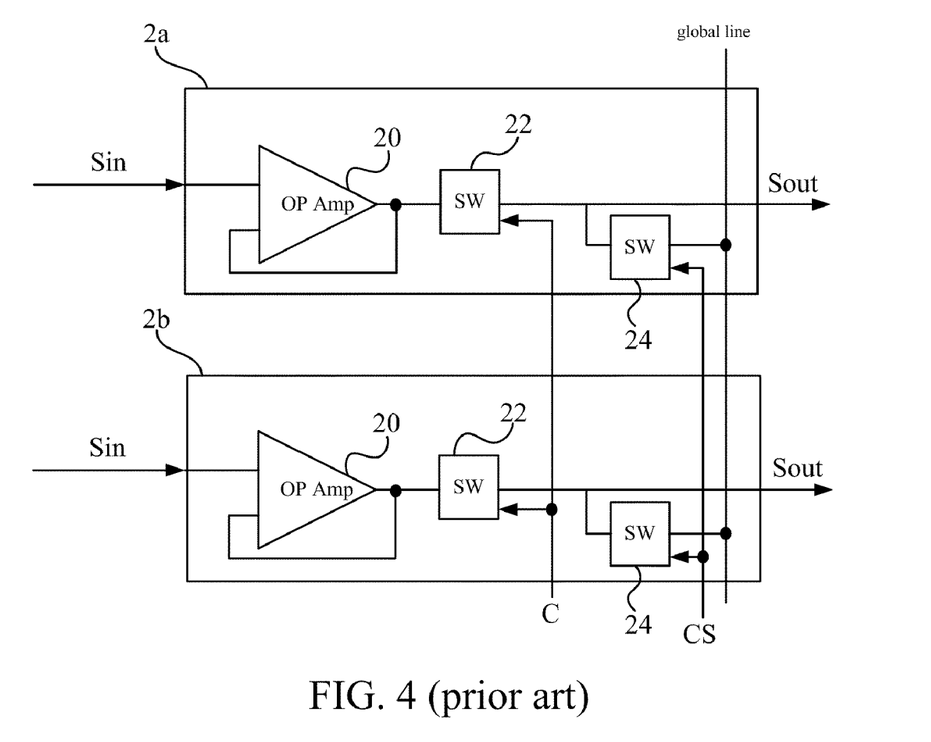
FIG. 4 is a schematic diagram illustrating a driving circuit system and a driving circuit system in prior art.
Figure 5:
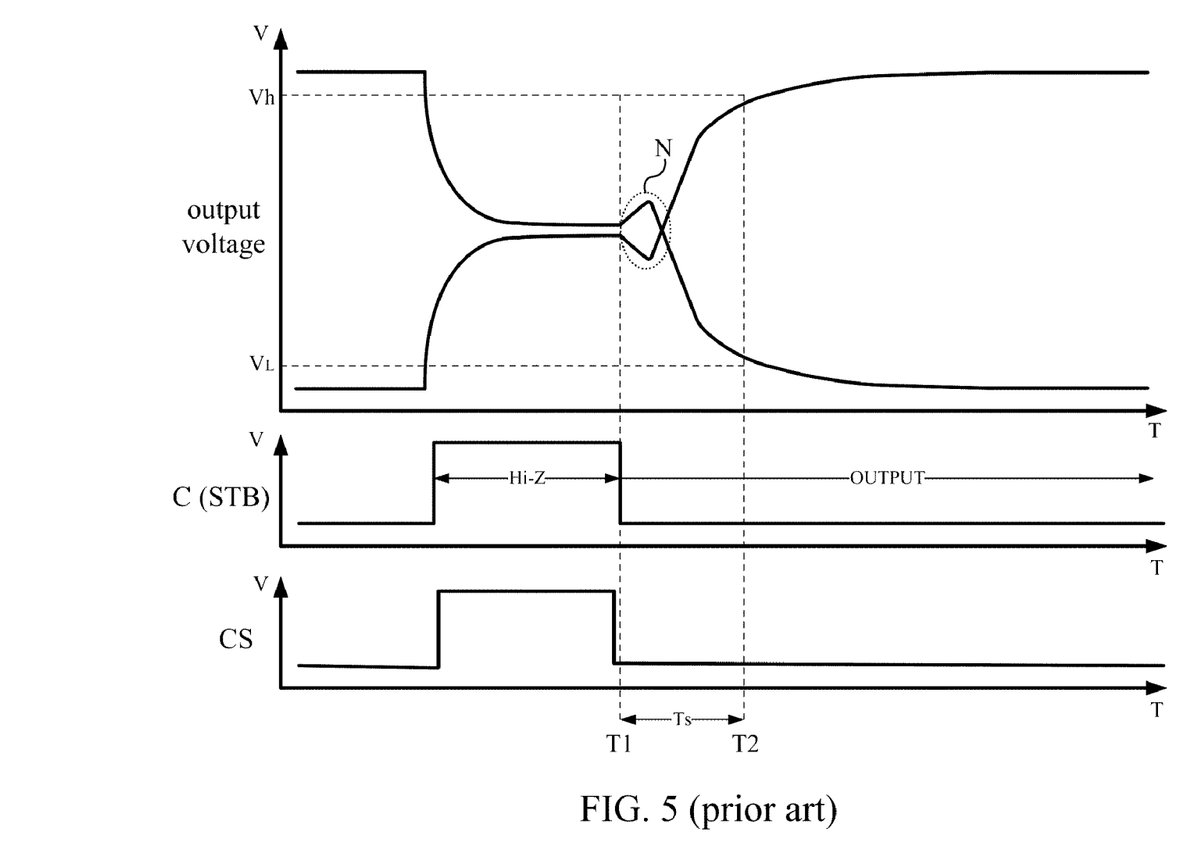
FIG. 5 is a timing diagram illustrating the relation between the output voltage of the operational amplifier in FIG. 4 and the control signal under charge sharing condition.

On the other hand, in order to drive a great deal of pixel loads, the present source driver circuit must have a lots of the driving circuit (such as said driving circuit system 1) for corresponding the pixel loads, and it results in a heavy consumption of electricity. Therefore, the source driver circuit in practical application usually includes a charge sharing circuit structure. Please refer to FIG. 4 and FIG. 5 as well. FIG. 4 is a schematic diagram illustrating a driving circuit system 2a and a driving circuit system 2b in prior art. FIG. 5 is a timing diagram illustrating the relation between the output voltage of the operational amplifier 20 in FIG. 4 and the control signal under charge sharing condition. As shown in FIG. 4, each driving circuit system includes an operational amplifier 20, feedback loop cooperating with the operational amplifier 20, an output switch 22 and another output switch 24. There are two sets of the driving circuit systems (2a, 2b) shown in FIG. 4 for explanation, however the total number of sets of the driving circuit systems should correspond to the total number of the pixel capacitor to be driven.

Compared with said driving circuit system, the biggest difference of the driving circuit system in FIG. 4 is to include the output switches 24 controlled by the charge sharing signal CS, so as to form the charge sharing circuit structure.

As shown in FIG. 5, the charge sharing signal may control the output switches 24 to join output voltages at different voltage levels. For example, originally the output voltage of the driving circuit system 2a locates at the high level and the output voltage of the driving circuit system 2b locates at the low level. When the charge sharing signal CS turns on the output switches 24, the output voltages are adjusted to an intermediate level in a way of shorting and averaging two output voltages. It does not need extra power supply such that the power consumption can be reduced.

However, the driving circuit system with charge sharing structure would generate an output voltage noise (as the noise N shown in FIG. 5) at the negative edge of the control signal C (usually the STB signal in practical usage). The noise decreases the stability of the driving circuit system.

Therefore, the invention discloses a driving circuit system and a method capable of elevating a slew rate of an operational amplifier, so as to solve said problems.

SUMMARY OF THE INVENTION

A scope of the invention is to provide a driving circuit system including an operational amplifier, a judging module and a bias enhancing module. The operational amplifier has an input stage driven by a bias current. The bias enhancing module is electrically connected to the judging module and the input stage of the operational amplifier respectively.

According to an embodiment, the judging module is used for generating a bias enhancing signal according to an edge trigger of a control signal. When the bias enhancing module receives the bias enhancing signal, the bias enhancing module provides an additive current, which is used for cooperating with the bias current to drive the input stage of the operational amplifier, such that a slew rate of the operational amplifier is elevated.

Another scope of the invention is to provide a driving circuit system including an operational amplifier, a judging module and a bias enhancing module. The operational amplifier has a rail-to-rail input stage. The rail-to-rail input stage includes a first differential input pair driven by a first bias current and a second differential input pair driven by a second bias current. The bias enhancing module is electrically connected to the judging module and the rail-to-rail input stage of the operational amplifier respectively.

According to an embodiment, the judging module is used for generating a bias enhancing signal according to an edge trigger of a control signal. When the bias enhancing module receives the bias enhancing signal, the bias enhancing module provides a first additive current and a second additive current respectively for cooperating with the first bias current and the second bias current to drive the first differential input pair and the second differential input pair of the input stage, such that a slew rate of the operational amplifier is elevated.

Another scope of the invention is to provide a method of elevating a slew rate of an operational amplifier. The method includes steps of: (a) generating a bias enhancing signal according to an edge trigger of a control signal; (b) receiving the bias enhancing signal and generating an additive current; and (c) driving the operational amplifier with the additive current cooperating with a bias current, for elevating the slew rate of the operational amplifier.

The edge trigger mentioned in the invention can be a positive edge trigger and/or a negative edge trigger. In an embodiment, the invention can respectively sense the rising edge (positive edge) and the falling edge (negative edge), at which the control signal begins to change, and generate the bias enhancing signal. It may respectively generate the additive current for cooperating with the bias current to drive the input stage of the operational amplifier, such that the slew rate of the operational amplifier is elevated at these two time points (rising edge and falling edge). Accordingly, it may respectively prevent the negative influence from the charge sharing structure and accelerate the response time of the operational amplifier served as the output buffer.

The driving circuit system and the method of elevating a slew rate of an operational amplifier of the invention utilize a simple current switching circuit to cooperate with the existing control signal for elevating the slew rate of the operational amplifier at particular time point. Compared with prior art, the driving circuit system of the invention may only utilize simple circuit structure and signal judgment to accelerate the response time of the operational amplifier under low steady current consumption, and to reduce the problem caused by the charge sharing structure at the same time. It can be implemented in a source driver circuit of a large-sized and fast-responding display device.

The advantage and spirit of the invention may be understood by the following recitations together with the appended drawings.

DETAILED DESCRIPTION OF THE INVENTION

In modern signal processing system, there is usually a pulse-type control signal used for controlling the operating state of an output buffer. In the application of the output buffer of a source driver circuit, the control signal is usually the strobe signal, which is so-called the STB signal.

At the rising edge of the STB signal (changing from the low level to the high level), the output buffer loads the video information and temporarily stores the video information; at the falling edge of the STB signal (changing from the high level to the low level), the output buffer generates a voltage output signal according to the stored signal in the output buffer, for driving the pixel capacitor loads. The time spot, at which the video-related signal actually varies, happens at the rising edge or the falling edge of the STB signal.

At said falling edge (negative edge) of the STB signal, the output buffer generates voltage output signal for driving the pixel capacitor load. However, the elevating waveform of the voltage output signal is not an ideal step shape. It goes with a certain delay and takes a certain settling time to complete.

Figure 6:
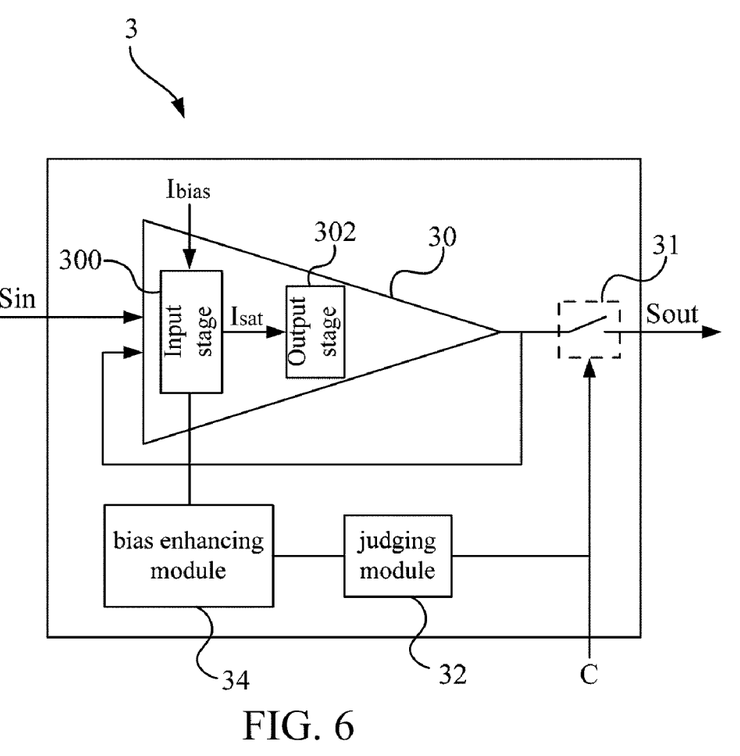
FIG. 6 is a schematic diagram illustrating a driving circuit system according to a first embodiment of the invention.

Please refer to FIG. 6. FIG. 6 is a schematic diagram illustrating a driving circuit system 3 according to a first embodiment of the invention. As shown in FIG. 6, the driving circuit system 3 includes an operational amplifier 30, an output switch 31, a judging module 32 and a bias enhancing module 34.

In the embodiment, the operational amplifier 30 has an electronic feedback loop connected between the output terminal and one of the input terminals of the operational amplifier 30. In theory of a latch structure, the operational amplifier 30 with the electronic feedback loop may act like an output buffer. The output terminal of the operational amplifier 30 is further connected to the output switch 31. The output switch 31, controlled by a control signal C, can cooperate with the operational amplifier 30 and can be switched between the action of registering the input signal Sin and the action of generating output signal Sout performed by the output buffer. The control signal C here can be an STB signal or an equivalent pulse signal.

The operational amplifier 30 has an input stage 30 and an output stage 302. The input stage 300 is driven by a bias current $I_{bias}$. The input stage 300 receives the input signal Sin and generates a working current $I_{sat}$ transmitted to the output stage 302. The output stage 302 can produce the output signal Sout. The output stage 302 has a compensation capacitor. The speed of variation of the output signal Sout is limited by the slew rate of the operation amplifier 300. The formula of the slew rate is listed as follows:

$$\text{slew rate} = \frac{dV}{dT} = \frac{I_{sat}}{C_C}; C_c$$

means the capacitance of the compensation capacitor.

The judging module 32, which is electrically connected to the bias enhancing module 34, receives the control signal C. The bias enhancing module 34 is further electrically connected to the input stage 300 of the operational amplifier 30. The bias enhancing module 34 can be a current switching circuit or other equivalent circuits, e.g. a circuit including a current source cooperating with an on/off switch, or a circuit including a voltage source cooperating with a transistor switch.

Figure 7:
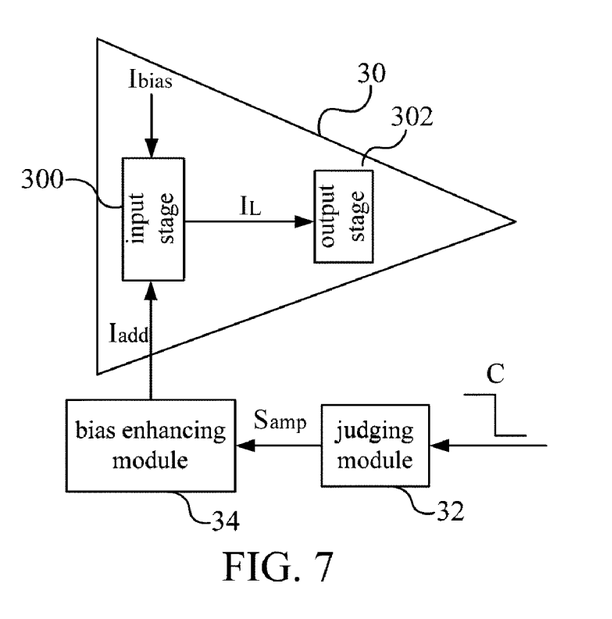
FIG. 7 is a schematic diagram illustrating the driving circuit system in FIG. 6 under the negative edge trigger of the control signal.

Please refer to FIG. 7. FIG. 7 is a schematic diagram illustrating the driving circuit system in FIG. 6 under a negative edge trigger of the control signal C. The judging module 32 detects the control signal C and senses the negative edge trigger of the control signal C. At this time, the output buffer in practical applications generates the voltage output signal for driving corresponding pixel capacitor loads. At the same time, the judging module generates a bias enhancing signal Samp according to the negative edge trigger of the control signal C.

The bias enhancing module 34 receives the bias enhancing signal Samp, and the bias enhancing module 34 provides an additive current Iadd to the input stage 300 of the operational amplifier 30. The additive current Iadd is used for cooperating with the bias current $I_{bias}$ to drive the input stage 300 of the operational amplifier 30. The input stage 300 generates an enhanced working current $I_L$ for elevating the slew rate. The enhanced working current $I_L$ is larger than the original working current $I_{sat}$, such that the slew rate of the operational amplifier 30 is elevated.

In another embodiment, the judging module 32 in FIG. 6 can be used for detecting the rising edge of the control signal C as well. When positive edge trigger of the control signal C is sensed, the judging module 32 can also generate the bias enhancing signal Samp, for activating the bias enhancing module 34 to provide the additive current Iadd. The additive current Iadd is transmitted to the input stage 300 of the operational amplifier 30 for elevating the slew rate of the operational amplifier 30. The detail theories and functions of these components and actions are similar to the previous descriptions in the invention, and are not repeated here.

Figure 8:
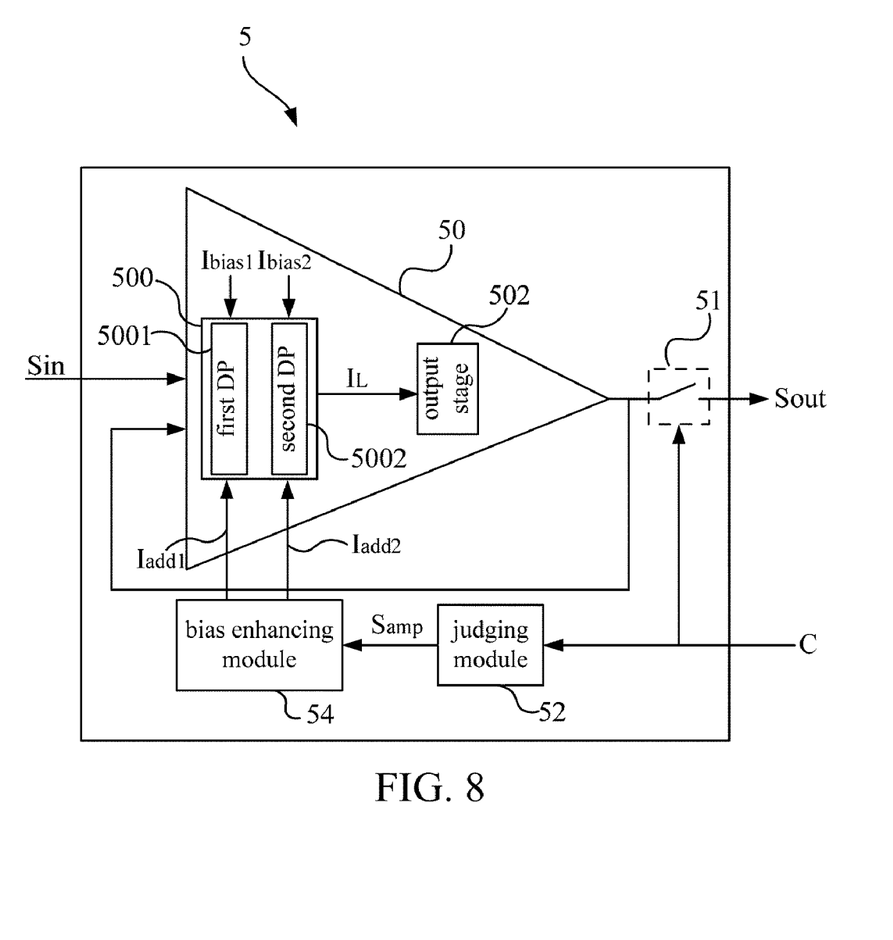
FIG. 8 is a schematic diagram illustrating a driving circuit system according to a second embodiment of the invention.

Please refer to FIG. 8. FIG. 8 is a schematic diagram illustrating a driving circuit system 5 according to a second embodiment of the invention. The difference from the first embodiment is that the operational amplifier 50 of driving circuit system 5 has a rail-to-rail input stage 500, as shown in FIG. 8. The rail-to-rail input stage 500 includes a first differential input pair 5001 driven by a first bias current $I_{bias1}$ and a second differential input pair 5002 driven by a second bias current $I_{bias2}$.

When the judging module 52 detects an edge trigger (positive edge trigger or negative edge trigger) of a control signal C, the judging module 52 generates a bias enhancing signal Samp. The bias enhancing signal Samp is used for activating the bias enhancing module 54 to provide a first additive current $I_{add1}$ and a second additive current $I_{add2}$. The first additive current $I_{add1}$ is used for cooperating with the first bias current $I_{bias1}$ to drive the first differential input pair 5001 of the rail-to-rail input stage 500. The second additive current $I_{add2}$ is used for cooperating with the second bias current $I_{bias2}$ to drive the second differential input pair 5002 of the rail-to-rail input stage 500. Accordingly, the rail-to-rail input stage 500 generates an enhanced working current $I_L$, such that the slew rate of the operational amplifier 50 is elevated.

In the embodiment, the rail-to-rail input stage 500 can be a parallel rail-to-rail input stage or an on/off rail-to-rail input stage. Take the parallel rail-to-rail stage for example. The first differential input pair 5001 and the second differential input pair 5002 can be formed, respectively, by a PMOS differential input pair and an NMOS differential input pair. The rail-to-rail stage 500 formed by paralleling the PMOS and the NMOS differential input pair can mutually compensate the Input Common Mode Range (ICMR).

In the embodiment, the bias enhancing module 54 can consist of two sets of current switching circuits or two sets of other equivalent circuits, e.g. two sets of current sources cooperating with corresponding on/off switches, or two sets of voltage sources cooperating with corresponding transistor switches.

Figure 9:
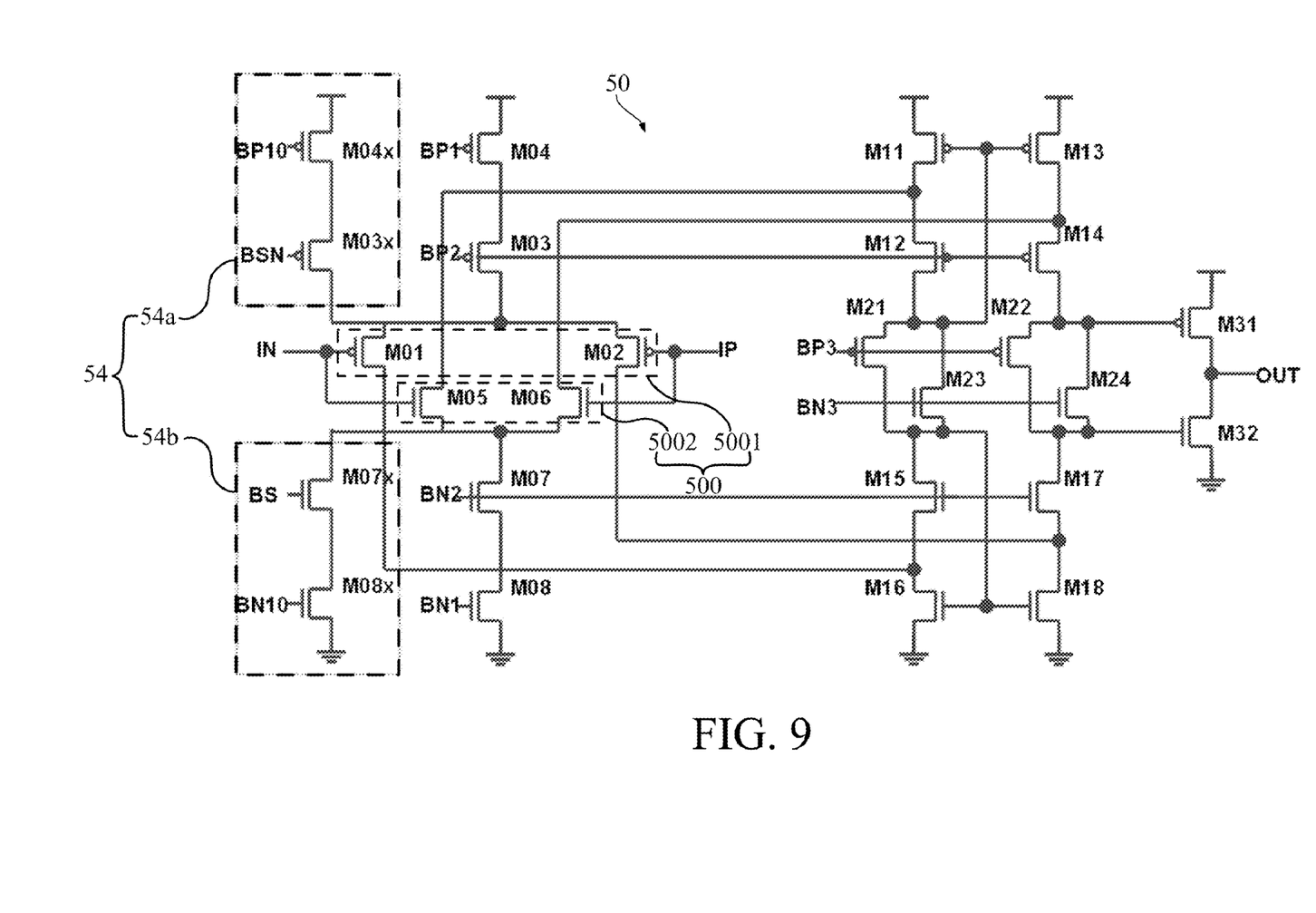
FIG. 9 is a circuit pattern diagram illustrating the operational amplifier and the corresponding bias enhancing module in FIG. 8.

Please refer to FIG. 9. FIG. 9 is a circuit pattern diagram illustrating the operational amplifier 50 and the corresponding bias enhancing module 54 in FIG. 8. As shown in FIG. 9, the bias enhancing module 54 includes a first bias enhancing unit 54a and a second bias enhancing unit 54b, which correspond to the first differential input pair 5001 and the second differential input pair 5002 respectively.

As shown in FIG. 9, the first bias enhancing unit 54a in the embodiment can be formed by two connected-in-series PMOSs cooperating with a voltage source. The PMOS M04x and the voltage source are equivalent to a current source. Besides, the other PMOS M03x is served as an on/off switch. The gate of the PMOS M03x, i.e. input terminal BSN in FIG. 9, is controlled by the bias enhancing signal Samp. Therefore, the gate of the PMOS M03x is equivalent to the on/off switch of whole first bias enhancing unit 54a. Consequently, the first bias enhancing unit 54a can provide the first additive current $I_{add1}$ to the first differential pair 5001 corresponding to the bias enhancing signal Samp.

On the other hand, the second bias enhancing unit 54b can provide the second additive current $I_{add2}$ to the second differential pair 5002 corresponding to the bias enhancing signal Samp as well.

Figure 10:
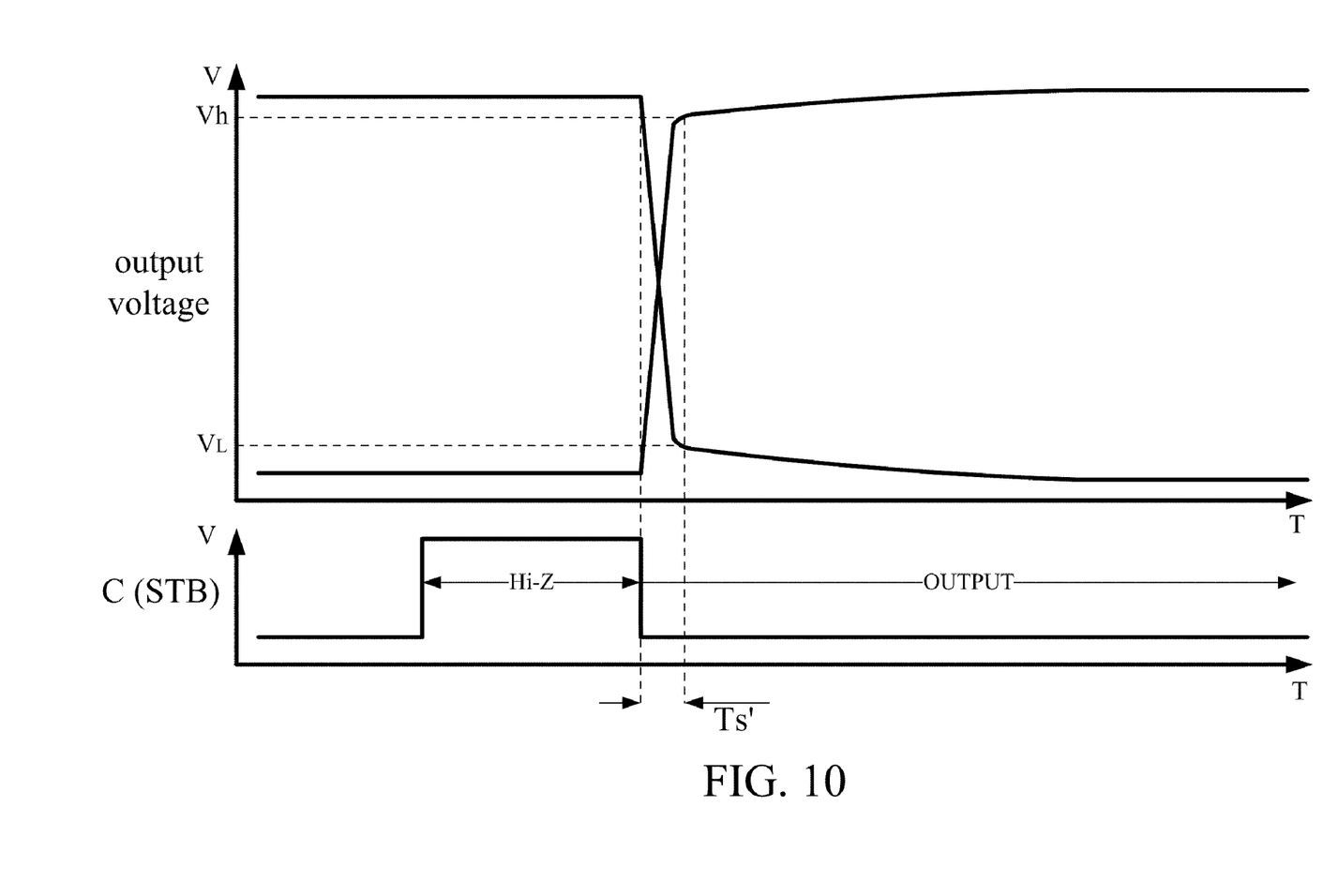
FIG. 10 is a timing diagram illustrating the output voltage and the control signal of the operational amplifier in FIG. 9 cooperating with the corresponding bias enhancing module.

Please refer to the FIG. 10 as well. FIG. 10 is a timing diagram illustrating the output voltage and the control signal C of the operational amplifier 50 in FIG. 9 cooperating with the corresponding bias enhancing module 54.

As shown in FIG. 10, in the driving circuit system 5, the operational amplifier 50 has higher slew rate because the operational amplifier 50 cooperates with the corresponding bias enhancing module 54. At the negative edge trigger of the control signal C (STB signal), the output voltage begins to change. Because of the higher slew rate, it takes shorter settling time Ts' to complete the signal shift, in other words, it has an accelerated response time.

Figure 11:
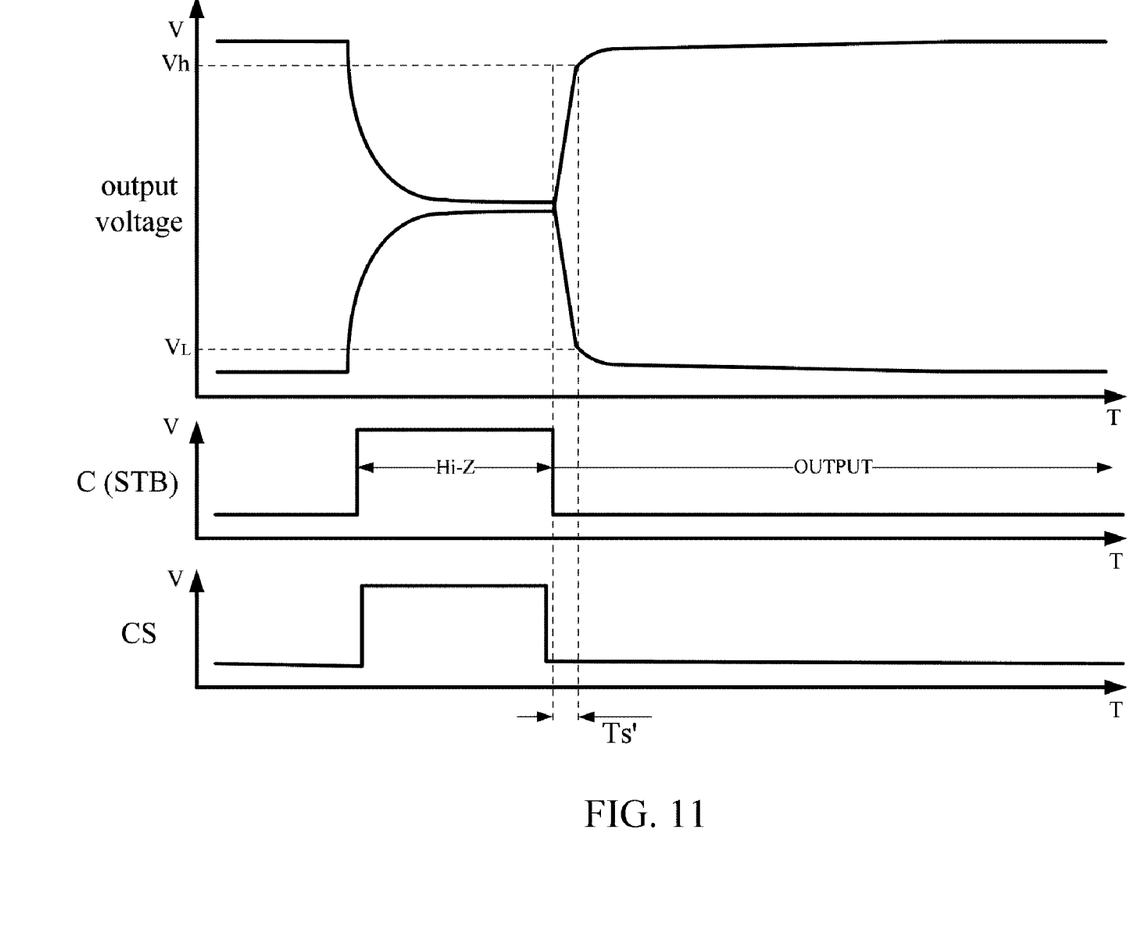
FIG. 11 is a timing diagram illustrating the output voltage and the control signal of the operational amplifier in FIG. 9 cooperating with the corresponding bias enhancing module under charge sharing.

On the other hand, in another embodiment, multiple driving circuit systems 5 can be set up with a charge sharing structure. In this case, each driving circuit system 5 further includes another on/off switch controlled by the charge sharing signal CS. The on/off switches may link output terminals of every driving circuit system 5 together via a global line. The charge sharing structure is well known by a person skilled in the art, so related descriptions are not presented here. Please refer to FIG. 11. FIG. 11 is a timing diagram illustrating the output voltage and the control signal C of the operational amplifier 50 in FIG. 9 cooperating with the corresponding bias enhancing module 54 under charge sharing.

As shown in FIG. 11, after adding the charge sharing structure, the operational amplifier 50, which cooperates with the corresponding bias enhancing module 54, has shorter settling time Ts' and faster response time, besides it can prevent the noise caused by the charge sharing structure.

Through the circuit structure in FIG. 9 cooperating with the judging module 52 in FIG. 8 capable of detecting the edge trigger of the control signal C, it can realize the driving circuit system 5 with rail-to-rail input, low power consumption, high slew rate and without negative effects of charge sharing.

Figure 12:
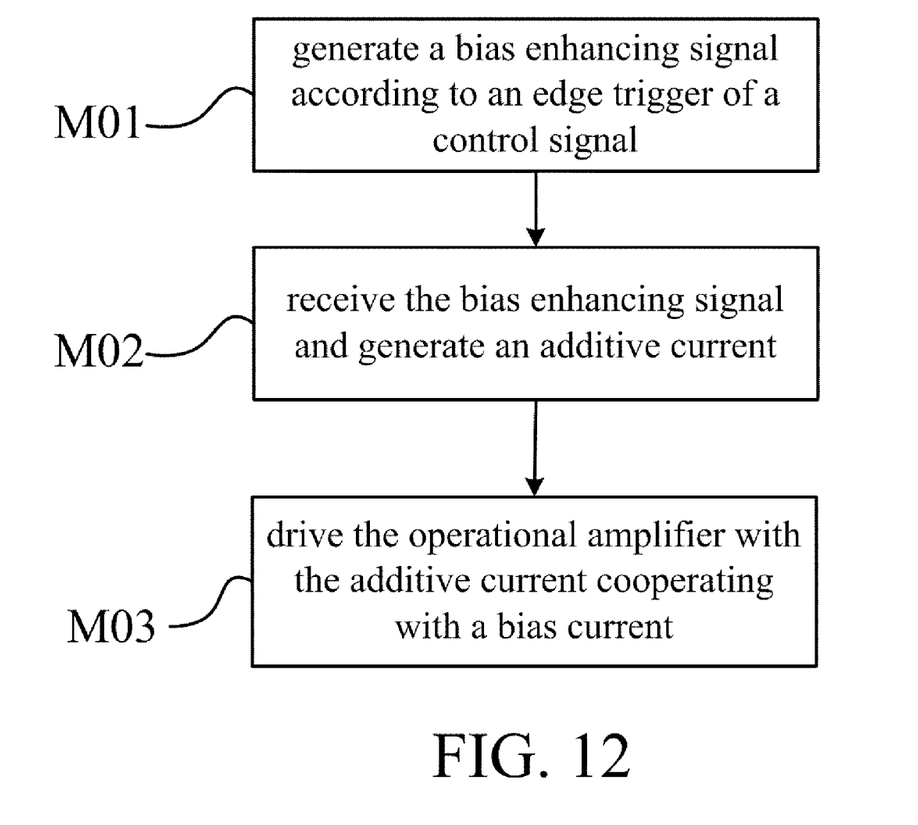
FIG. 12 is a flowchart illustrating a method of elevating a slew rate of an operational amplifier according to a third embodiment of the invention.

Please refer to FIG. 12. FIG. 12 is a flowchart illustrating a method of elevating a slew rate of an operational amplifier according to a third embodiment of the invention. The method includes steps as follows. Firstly, step M01 is performed to generate a bias enhancing signal according to an edge trigger of a control signal. The control signal C can be a STB signal or an equivalent pulse signal. The control signal C is used for switching the actions performed by the output buffer between registering the input signal Sin and generating output signal Sout. The edge trigger mentioned in the invention can be a positive edge trigger and/or a negative edge trigger. In practical application, it may respectively prevent the negative influence from the charge sharing structure and accelerate the response time of the operational amplifier served as the output buffer.

Afterward, step M02 is performed to receive the bias enhancing signal and generate an additive current. In an embodiment, the bias enhancing signal is transmitted to a bias enhancing module. The bias enhancing module may include a current source and an on/off switch for forming a current switching circuit. When the on/off switch is turned on after receiving the bias enhancing signal, the additive current is delivered from the current source of the bias enhancing module.

Finally, step M03 is performed to drive the operational amplifier with the additive current cooperating with a bias current, for elevating the slew rate of the operational amplifier. In step M03, by utilizing the additive current to cooperate with a bias current, it activates the operational amplifier to generate an enlarged working current. When the working current is enlarged, the charging time of the compensation capacitor is cut, such that the output signal shifts faster so as to elevate the slew rate.

Compared with prior art, the driving circuit system and the method of elevating a slew rate of an operational amplifier of the invention can respectively sense the rising edge and the falling edge, at which the control signal begins to change, and generate the bias enhancing signal. It may respectively generate the additive current for cooperating with the bias current to drive the operational amplifier, such that the slew rate of the operational amplifier is elevated at these two time points (rising edge and falling edge). Accordingly, it may respectively prevent the negative influence from the charge sharing structure and accelerate the response time of the operational amplifier served as the output buffer. The driving circuit system and the method of elevating a slew rate of an operational amplifier of the invention utilize a simple current switching circuit to cooperate with the existing control signal for elevating the slew rate of the operational amplifier at particular time point. The driving circuit system can accelerate the response time of the operational amplifier under low steady current consumption and reduce the problem caused by the charge sharing structure at the same time.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A driving circuit system, comprising:
an operational amplifier having an input stage driven by a bias current;
a judging module, for generating a bias enhancing signal according to an edge trigger of a control signal; and
a bias enhancing module electrically connected to the judging module and the input stage of the operational amplifier, when the bias enhancing module receiving the bias enhancing signal, the bias enhancing module providing an additive current for cooperating with the bias current to drive the input stage of the operational amplifier such that a slew rate of the operational amplifier is elevated.

2. The driving circuit system of claim 1, wherein when the additive current cooperates with the bias current to drive the input stage of the operational amplifier, the input stage generates an enhanced working current for elevating the slew rate.

3. The driving circuit system of claim 1, wherein the control signal is a STB signal, and the driving circuit system serves as an output buffer of a source driver circuit.

4. The driving circuit system of claim 1, wherein the control signal is a pulse signal.

5. The driving circuit system of claim 1, wherein the edge trigger is a positive edge trigger.

6. The driving circuit system of claim 1, wherein the edge trigger is a negative edge trigger.

7. A driving circuit system, comprising:
an operational amplifier having a rail-to-rail input stage, the rail-to-rail input stage comprising a first differential input pair driven by a first bias current and a second differential input pair driven by a second bias current;

a judging module, for generating a bias enhancing signal according to an edge trigger of a control signal; and a bias enhancing module electrically connected to the judging module and the input stage of the operational amplifier, when the bias enhancing module receiving the bias enhancing signal, the bias enhancing module providing a first additive current and a second additive current respectively for cooperating with the first bias current and the second bias current to drive the first differential input pair and the second differential input pair of the input stage such that a slew rate of the operational amplifier is elevated.

8. The driving circuit system of claim 7, wherein when the first additive current and the second additive current cooperates with the first bias current and the second bias current respectively to drive the first differential input pair and the second differential input pair of the rail-to-rail input stage, the rail-to-rail input stage generates an enhanced working current for elevating the slew rate.

9. The driving circuit system of claim 7, wherein the control signal is a STB signal, and the driving circuit system serves as an output buffer of a source driver circuit.

10. The driving circuit system of claim 7, wherein the control signal is a pulse signal.

11. The driving circuit system of claim 7, wherein the edge trigger is a positive edge trigger.

12. The driving circuit system of claim 7, wherein the edge trigger is a negative edge trigger.

13. A method of elevating a slew rate of an operational amplifier, comprising steps of:
 (a) generating a bias enhancing signal according to an edge trigger of a control signal;
 (b) receiving the bias enhancing signal and generating an additive current; and
 (c) driving the operational amplifier with the additive current cooperating with a bias current, for elevating the slew rate of the operational amplifier.

14. The method of claim 13, wherein step (c) drives the operational amplifier to generate an enhanced working current for elevating the slew rate.

15. The method of claim 13, wherein the control signal is a STB signal, and the driving circuit system serves as an output buffer of a source driver circuit.

16. The method of claim 13, wherein the control signal is a pulse signal.

17. The method of claim 13, wherein the edge trigger is a positive edge trigger.

18. The method of claim 13, wherein the edge trigger is a negative edge trigger.

* * * * *